United States Patent
Takagi et al.

(10) Patent No.: US 10,748,780 B2
(45) Date of Patent: Aug. 18, 2020

(54) MANUFACTURING METHOD OF SILICON CARBIDE SEMICONDUCTOR DEVICE

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Shigeyuki Takagi, Kariya (JP); Masaki Shimomura, Kariya (JP); Yuichi Takeuchi, Kariya (JP); Katsumi Suzuki, Nagakute (JP); Sachiko Aoi, Nagakute (JP)

(73) Assignees: DENSO CORPORATION, Kariya (JP); TOYOTA JIDOSHA KABUSHIKI KAISHA, Toyota-shi (JP)

(*) Notice: Subject to any disclaimer, the term of this patent is extended or adjusted under 35 U.S.C. 154(b) by 0 days.

(21) Appl. No.: 16/353,670

(22) Filed: Mar. 14, 2019

(65) Prior Publication Data
US 2019/0214264 A1    Jul. 11, 2019

Related U.S. Application Data

(63) Continuation of application No. PCT/JP2017/036349, filed on Oct. 5, 2017.

(30) Foreign Application Priority Data

Oct. 5, 2016  (JP) .................................. 2016-197414
Sep. 19, 2017  (JP) .................................. 2017-179442

(51) Int. Cl.
*H01L 21/3065*    (2006.01)
*H01L 29/10*    (2006.01)
(Continued)

(52) U.S. Cl.
CPC .... *H01L 21/3065* (2013.01); *H01L 21/02337* (2013.01); *H01L 21/31116* (2013.01);
(Continued)

(58) Field of Classification Search
CPC .............. H01L 21/3065; H01L 29/1095; H01L 29/66068; H01L 29/872; H01L 29/6606;
(Continued)

(56) References Cited

U.S. PATENT DOCUMENTS

2001/0005031 A1    6/2001  Sakamoto et al.
2007/0108512 A1*   5/2007  Sedlmaier ........... H01L 29/7813
                                                257/328
(Continued)

FOREIGN PATENT DOCUMENTS

| JP | 2006-100357 A | 4/2006 |
| JP | 2009-170558 A | 7/2009 |
| JP | 2010-135552 A | 6/2010 |

OTHER PUBLICATIONS

"Planarization of epitaxial SiC trench structures by plasma ion etching"; Silicon Carbide and Related Materials; 2014; pp. 549-552; authored by A.Z. Zhang, S.A. Reshanov, A. Schoner, W. Kaplan, N. Kwietniewski, J.K. Lim and M. Bakowski.

*Primary Examiner* — Mohammed R Alam
(74) *Attorney, Agent, or Firm* — Posz Law Group, PLC

(57) ABSTRACT

In a manufacturing method of a silicon carbide semiconductor device, a semiconductor substrate made of silicon carbide and on which a base layer is formed is prepared, a trench is provided in the base layer, a silicon carbide layer is epitaxially formed on a surface of the base layer while filling the trench with the silicon carbide layer, the sacrificial layer is planarized by reflow after forming the sacrificial layer, and the silicon carbide layer is etched back together with the planarized sacrificial layer by dry etching under an (Continued)

etching condition in which an etching selectivity of the silicon carbide layer to the sacrificial layer is 1.

5 Claims, 10 Drawing Sheets

(51) Int. Cl.

| | | |
|---|---|---|
| H01L 29/66 | (2006.01) | |
| H01L 29/872 | (2006.01) | |
| H01L 29/16 | (2006.01) | |
| H01L 23/544 | (2006.01) | |
| H01L 21/02 | (2006.01) | |
| H01L 21/311 | (2006.01) | |
| H01L 29/78 | (2006.01) | |

(52) U.S. Cl.
CPC ........ *H01L 23/544* (2013.01); *H01L 29/1095* (2013.01); *H01L 29/1608* (2013.01); *H01L 29/6606* (2013.01); *H01L 29/66068* (2013.01); *H01L 29/7813* (2013.01); *H01L 29/872* (2013.01); *H01L 2223/54426* (2013.01)

(58) Field of Classification Search
CPC ............... H01L 29/1608; H01L 23/544; H01L 21/31116; H01L 29/7813; H01L 2223/54426; H01L 29/42376; H01L 29/7397; H01L 29/045; H01L 29/402; H01L 29/0619
See application file for complete search history.

(56) References Cited

U.S. PATENT DOCUMENTS

| | | | |
|---|---|---|---|
| 2008/0050876 A1* | 2/2008 | Matocha | H01L 29/0634 438/269 |
| 2008/0292991 A1* | 11/2008 | Wallow | G03F 7/0035 430/312 |
| 2009/0124060 A1 | 5/2009 | Nagaya et al. | |
| 2015/0206941 A1 | 7/2015 | Uehigashi et al. | |
| 2016/0104794 A1* | 4/2016 | Takeuchi | H01L 29/1608 257/77 |

* cited by examiner

US 10,748,780 B2

MANUFACTURING METHOD OF SILICON CARBIDE SEMICONDUCTOR DEVICE

CROSS REFERENCE TO RELATED APPLICATIONS

The present application is a continuation application of International Patent Application No. PCT/JP2017/036349 filed on Oct. 5, 2017, which designated the U.S. and claims the benefit of priority from Japanese Patent Application No. 2016-197414 filed on Oct. 5, 2016 and Japanese Patent Application No. 2017-179442 filed on Sep. 19, 2017. The entire disclosures of all of the above applications are incorporated herein by reference.

TECHNICAL FIELD

The present disclosure relates to a manufacturing method of a silicon carbide (hereinafter referred to as "SiC") semiconductor device.

BACKGROUND

Conventionally, there has been a SiC semiconductor device having a structure in which a trench is provided in a base layer made of SiC and then a SiC layer is buried only in the trench.

SUMMARY

The present disclosure provides a manufacturing method of a silicon carbide semiconductor device that includes preparing a semiconductor substrate made of silicon carbide and on which a base layer is formed, providing a trench in the base layer, epitaxially growing a silicon carbide layer on a surface of the base layer while filling the trench with the silicon carbide layer, forming a sacrificial layer on a surface of the silicon carbide layer, planarizing the sacrificial layer by reflow after forming the sacrificial layer, and etching back the silicon carbide layer together with the planarized sacrificial layer by dry etching under an etching condition in which an etching selectivity of the silicon carbide layer to the sacrificial layer is 1.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

Figure 1:
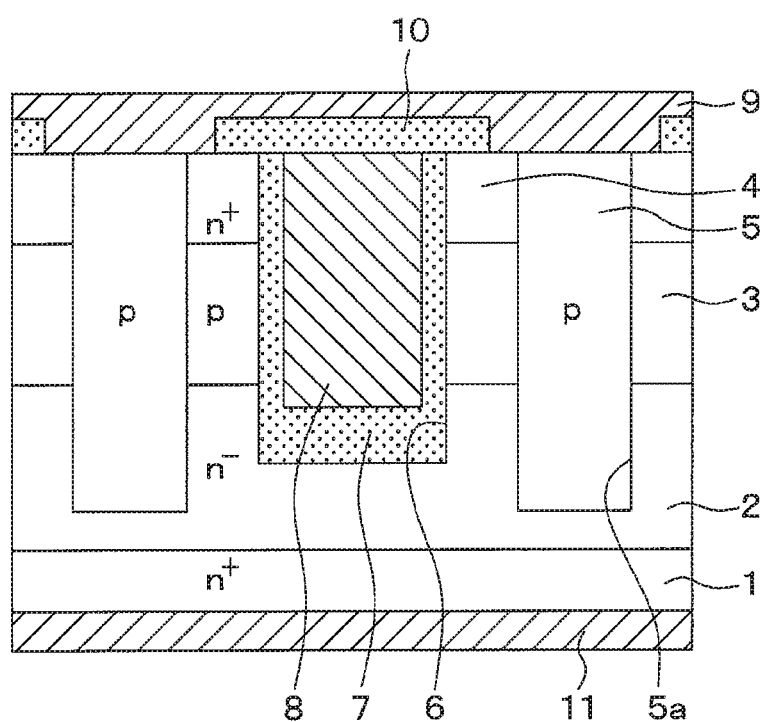
FIG. 1 is a cross-sectional view of a vertical MOSFET included in a SiC semiconductor device according to a first embodiment.

Before describing embodiments of the present disclosure, a manufacturing method of a SiC semiconductor device according to a comparative example will be described. In the manufacturing method of a SiC semiconductor device according to the comparative example, a buried epitaxial growth is performed so as to fill a trench provided in a base layer with a SiC layer, and then a portion of the SiC layer formed on a surface of the base layer is removed to planarize the SiC layer. More specifically, the surface of the SiC layer is planarized by the following manufacturing method.

First, the trench is provided in the base layer, and then the buried epitaxial growth is performed so as to fill the trench with the SiC layer. At this time, a surface of the SiC layer is formed in a concave and convex shape so as to be concave at a position corresponding to a portion buried in the trench and to protrude at a portion where the trench is not provided. Therefore, if the SiC layer is simply etched back to remove a portion of the SiC layer formed above the surface of the base layer, unevenness of the surface remains, and the surface of the SiC layer cannot be planarized.

Thus, a low temperature oxidation (LTO) film is formed so as to cover the surface of the SiC layer, and a polymeric film is formed so as to cover a surface of the SiC layer. Even if the LTO is formed so as to cover the surface of the SiC layer, the unevenness of the surface of the LTO remains. Therefore, the LTO is further covered with a polymer film whose surface becomes flat.

After the polymer film and the LTO film are formed in this manner, the polymer film and the LTO film are etched back so that an etching selectivity becomes 1, that is, the polymer film and the LTO film are etched at the same rate. Accordingly, regardless of the unevenness of the surface of the LTO, the polymer film and the LTO are etched back at the same rate, that is, while the polymer film and the surface of the LTO being in a flat state. Subsequently, when the polymer film has been removed, etching conditions such as etching gas are switched, and the LTO and the SiC layer are etched back so that an etching selectivity of the LTO and the SiC layer becomes 1. Accordingly, the LTO and the SiC layer are etched back at the same rate while the surfaces remain flat. The LTO and the SiC layer are continuously etched back until the base layer is exposed.

According to the above-described manufacturing method, a SiC single crystal device in which a SiC layer is left only in the trench provided in the base layer can be manufactured.

However, the above-described manufacturing method requires a process for manufacturing a polymer film on the SiC layer in addition to the LTO. In addition, a two-step etching back process is required in which the polymer film and the LTO are etched back so as to have an etching selectivity of 1, and then the LTO and the SiC layer are etched back so as to have an etching selectivity of 1. Therefore, the manufacturing method becomes complicated and the manufacturing cost becomes high.

Here, a structure in which a SiC layer is left in a trench has been described as an example of a case where an etching back for planarization is performed when unevenness is formed on a surface. However, as a structure for performing planarization when unevenness is formed on a surface, other structures can also be used. For example, unevenness based on step bunching may be formed when an epitaxial growth is performed on an off-substrate having an off-angle, or unevenness based on step bunching may be formed by an activation annealing treatment after ion implantation of impurities. In those cases as well, the above-mentioned issues arise in the same manner.

A manufacturing method of a SiC semiconductor device according to a first aspect of the present disclosure includes preparing a semiconductor substrate made of SiC and on which a base layer is formed, providing a trench in the base layer, epitaxially growing a SiC layer on a surface of the base layer while filling the trench with the SiC layer, forming a sacrificial layer on a surface of the SiC layer, planarizing the sacrificial layer by reflow after forming the sacrificial layer, and etching back the SiC layer together with the planarized sacrificial layer by dry etching under an etching condition in which an etching selectivity of the SiC layer to the sacrificial layer is 1.

In this manner, when a portion of the SiC layer formed above the surface of the base layer is removed, a fluid sacrificial layer is formed on the SiC layer. Since the surface of the sacrificial layer is flat due to the fluidity, the SiC layer can be removed so that the surface of the SiC layer becomes flat by etching back the SiC layer together with the sacrificial layer so that the etching selectivity becomes 1. Therefore, a manufacturing method of a SiC semiconductor device capable of planarizing the surfaces of the base layer and the SiC layer after the etch back in a simpler manner can be provided.

A manufacturing method of a SiC semiconductor device according to a second aspect of the present disclosure includes preparing a semiconductor substrate that is made of SiC and formed of an off-substrate having a main surface and an off-angle, epitaxially growing a SiC layer on the main surface of the semiconductor substrate, forming a sacrificial layer on an uneven surface having an unevenness based on step bunching, which is a surface of the SiC layer epitaxially grown, planarizing the sacrificial layer by reflow after forming the sacrificial layer, and etching back the SiC layer together with the planarized sacrificial layer by dry etching under an etching condition in which an etching selectivity ratio of the SiC layer to the sacrificial layer is 1.

As described above, when the uneven surface of the epitaxially grown SiC layer is planarized, a sacrificial layer having fluidity is formed on the SiC layer. Also in this case, the SiC layer is etched back together with the sacrificial layer so that the etching selectivity ratio becomes 1, with the result that the SiC layer can be removed so that the surface of the SiC layer becomes flat. Therefore, a manufacturing method of a SiC semiconductor device capable of planarizing the surface of the SiC layer after the etch back can be provided.

A manufacturing method of a SiC semiconductor device according to a third aspect of the present disclosure includes preparing a semiconductor substrate that is made of SiC and formed of an off-substrate having a main surface and an off-angle, epitaxially growing a SiC layer on the main surface of the semiconductor substrate, forming an impurity layer by performing an activation annealing treatment after ion implanting impurities on a surface of the SiC layer epitaxially grown, forming a sacrificial layer on an uneven surface having an unevenness based on step bunching, which is a surface of the SiC layer including the impurity layer subjected to the activation annealing treatment, planarizing the sacrificial layer by reflow after forming the sacrificial layer, and etching back the SiC layer including the impurity layer together with the planarized sacrificial layer by dry etching under an etching condition in which an etching selectivity ratio of the SiC layer to the sacrificial layer is 1.

As described above, when the uneven surface formed when the impurity layer is formed by ion implantation and activation annealing treatment on the SiC layer is planarized, a sacrificial layer having fluidity is formed on the SiC layer. Also in this case, the SiC layer is etched back together with the sacrificial layer so that the etching selectivity ratio becomes 1, with the result that the SiC layer and the impurity layer can be removed so that the surface of the SiC layer becomes flat. Therefore, a manufacturing method of a SiC semiconductor device capable of planarizing the surfaces of the SiC layer and the impurity layer after the etch back more simply can be provided.

Embodiments of the present disclosure will be described below with reference to the drawings. In the following embodiments, the same reference numerals are assigned to parts that are the same as or equivalent to each other for description.

First Embodiment

A first embodiment will be described. In a SiC semiconductor device according to the present embodiment, as shown in FIG. 1, a vertical MOSFET is formed as a semiconductor element. The vertical MOSFET is formed in a cell region of the SiC semiconductor device, and the SiC semiconductor device is configured by forming an outer peripheral high breakdown voltage structure so as to surround the cell area, but only the vertical MOSFET is illustrated. In the following description, a horizontal direction in FIG. 1 is taken as a width direction, and a vertical direction is taken as a thickness direction or a depth direction.

In the SiC semiconductor device, an n$^+$-type substrate 1 made of SiC is used as a semiconductor substrate. In the case of the present embodiment, a normal direction to a paper of FIG. 1 is made to coincide with an off-direction. As the n$^+$-type substrate 1, an off-substrate having a (0001) Si surface and a predetermined off-angle is used, and an off-direction is, for example, <11-20>. The n-type impurity concentration of the n$^+$-type substrate 1 is, for example, $1.0 \times 10^{19}/cm^3$.

On the main surface of the n$^+$-type substrate 1, an n$^-$-type drift layer 2 made of SiC, a p-type base region 3, and an n$^+$-type source region 4 are epitaxially grown in a stated order. The n$^-$-type drift layer 2 has, for example, an n-type impurity concentration of $0.5 \times 10^{16}/cm^3$ to $2.0 \times 10^{16}/cm^3$ and a thickness of 5 μm to 14 μm. The p-type base region 3 is a portion where a channel region is formed, has a p-type impurity concentration of, for example, about $2.0 \times 10^{17}/cm^3$ and a thickness of 0.5 μm to 2 μm. The n$^+$-type source region 4 has a higher impurity concentration than the impurity concentration of the n$^-$-type drift layer 2, and has the n-type impurity concentration in the surface layer portion of, for example, $2.5 \times 10^{18}/cm^3$ to $1.0 \times 10^{19}/cm^3$, and a thickness of about 0.5 μm to 2 μm.

A p-type deep layer 5 is formed so as to penetrate through the n$^+$-type source region 4 and the p-type base region 3 and reach the n$^-$-type drift layer 2. The p-type deep layer 5 is formed by filling a trench 5a having a width of 1 μm or less and a depth having an aspect ratio of 2 or more with a SiC layer by buried epitaxial growth, for example, and has a p-type impurity concentration higher than the impurity concentration of the p-type base region 3. Specifically, multiple p-type deep layers 5 are disposed at regular intervals in the n$^-$-type drift layer 2, and separate from each other without intersecting with each other so that a top layout is in a stripe shape. For example, each of the p-type deep layers 5 has a p-type impurity concentration of, for example, $1.0 \times 10^{17}/cm^3$ to $1.0 \times 10^{19}/cm^3$, a width of 0.7 μm, and a depth of 0.4 μm or more deeper than a total film thickness of the p-type base region 3 and the n$^+$-type source region 4.

In addition, a gate trench 6, for example, having a width of 0.8 μm and a depth of 0.2 μm to 0.4 μm deeper than the total film thickness of the p-type base region 3 and the n$^+$-type source region 4 is formed so as to penetrate through the p-type base region 3 and the n$^+$-type source region 4 and reach the n$^-$-type drift layer 2. The p-type base region 3 and the n$^+$-type source region 4 are disposed so as to be in contact with a side surface of the gate trench 6. The gate trench 6 is provided in a linear layout with a right and left direction of the paper of FIG. 1 as a width direction, a normal direction to the paper as a longitudinal direction, and an upper and lower direction of the paper as a depth direction. In addition, although only one gate trench 6 is shown in FIG. 1, multiple gate trenches 6 are disposed at regular intervals in the left and right directions of the paper so as to be sandwiched between the p-type deep layers 5, and formed in a stripe shape.

A portion of the p-type base region 3 located on a side surface of the gate trench 6 is a channel region that connects the n$^+$-type source region 4 and the n$^-$-type drift layer 2 when the vertical MOSFET is operated. A gate insulating film 7 is formed on an inner wall surface of the gate trench 6 including the channel region. A gate electrode 8 made of doped poly-Si is formed on a surface of the gate insulating film 7, and an inside of the gate trench 6 is filled with the gate insulating film 7 and the gate electrode 8.

A source electrode 9 and a gate wire layer are formed over the surfaces of the n$^+$-type source regions 4 and the p-type deep layer 5 and the gate electrode 8 across an interlayer insulating film 10. The source electrode 9 and the gate wire layer are made of a plurality of metals such as Ni/Al. A portion of the multiple metals contacting at least n-type SiC, specifically, the n+-type source region 4 and the gate electrode 8 in the case of the n-type doping, is made of metals that can make an ohmic contact with the n-type SiC. A portion of the multiple metals contacting at least p-type SiC, specifically, the p-type deep layers 5 is made of a metal that can make an ohmic contact with the p-type SiC. The source electrode 9 is electrically insulated by being formed on the interlayer insulating film 10. The source electrode 9 is brought in electrical contact with the n$^+$-type source region 4 and the p-type deep layers 5 through contact holes provided in the interlayer insulating film 10.

Further, a drain electrode 11 electrically connected to the n$^+$-type substrate 1 is formed on a rear surface of the n$^+$-type substrate 1. The above-described structure configures a vertical MOSFET of an n-channel type inverted trench gate structure. A cell region is formed by disposing multiple cells of the vertical MOSFET described above. The SiC semiconductor device is configured with the outer peripheral high breakdown voltage structure using a guard ring (not shown) or the like so as to surround the cell region in which the vertical MOSFET described above is formed.

In the SiC semiconductor device configured as described above, the n$^+$-type source region 4, the p-type base region 3, and the n$^-$-type drift layer 2 are used as a base layer, and the p-type deep layer 5 corresponding to the SiC layer is formed by buried epitaxial growth into the trench 5a. When the p-type base region 3 is formed, a portion of the p-type deep layer 5 formed by buried epitaxial growth on the base layer is removed by a manufacturing process which will be described later. Thus, the surfaces of the n$^+$-type source region 4 and the p-type deep layer 5 are flat surfaces with few damaged layers. Since the trench gate structure is formed on the flat surface with few damaged layers, the gate insulating film 7 is also formed with an excellent film quality. Therefore, the SiC semiconductor device capable of inhibiting a reduction in a gate life is provided. Next, referring to FIGS. 2A to 2H, 3A to 3D, 4A to 4D, 5A, and 5B, a process for manufacturing the SiC semiconductor device including the vertical MOSFET according to the present embodiment will be described. FIGS. 2A to 2H are cross-sectional views of the manufacturing process at a position corresponding to the vertical MOSFET shown in FIG. 1 in progress. FIGS. 3A to 3D and 4A to 4D are cross-sectional views different from FIG. 1, each showing a part of the cross-sectional view in the manufacturing process in a direction perpendicular to the direction parallel to <11-20>, which is an off-direction at the position where an alignment key is created. FIGS. 5A and 5B are layout diagrams when FIG. 3A and FIG. 4A, FIG. 3B, and FIG. 4B are viewed from above in the drawing. FIG. 3A corresponds to a cross-section taken along a line IIIA-IIIA in FIG. 5A, and FIG. 4A corresponds to a cross section taken along a line IVA-IVA in FIG. 5A. Also, FIG. 3B corresponds to a cross-section taken along a line IIIB-IIIB in FIG. 5B, and FIG. 4B corresponds to a cross-section taken along a line IVB-IVB in FIG. 5B. Layout diagrams as viewed from above in the paper corresponding to FIGS. 3C, 3D, 4C and 4D are not shown, but FIGS. 3C and 3D show cross-sections at the same position as FIGS. 3A and 3B, and FIGS. 4C and 4D show cross-sections at the same position as FIGS. 4A and 4B.

Figure 2A:
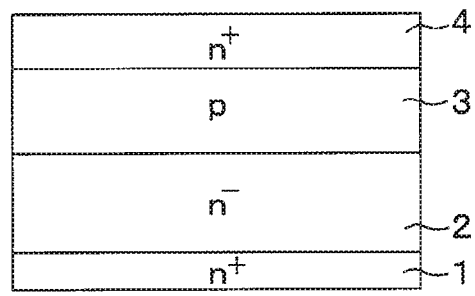
FIG. 2A is a cross-sectional view showing a process for manufacturing the vertical MOSFET shown in FIG. 1.
Figure 3A:
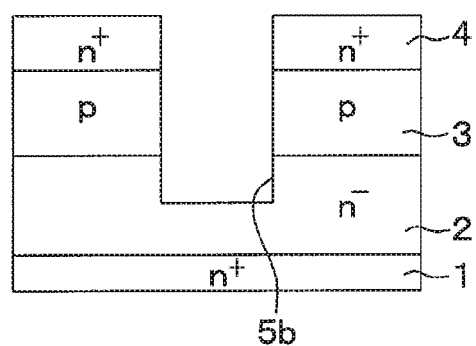
FIG. 3A is a cross-sectional view showing a process for manufacturing the vertical MOSFET shown in FIG. 1 at a position where an alignment key is formed.

[Process Shown in FIG. 2A]

First, a wafer-shaped n$^+$-type substrate 1 is prepared as a semiconductor substrate. Then, the n$^-$-type drift layer 2 made of SiC, the p-type base region 3 and the n$^+$-type source region 4 are epitaxially grown on the main surface of the n$^+$-type substrate 1 in order with a desired film thickness.

Figure 2B:
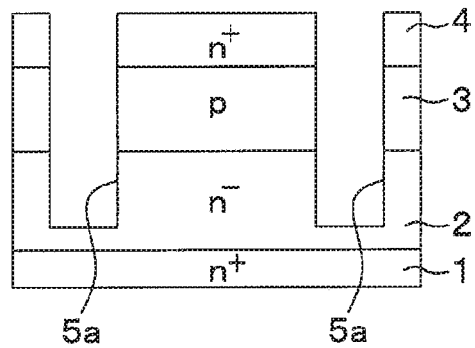
FIG. 2B is a cross-sectional view showing a process for manufacturing the vertical MOSFET continued from FIG. 2A.

[Process Shown in FIG. 2B]

Next, a mask (not shown) is disposed on the surface of the n$^+$-type source region 4, and a region of the mask where the p-type deep layer 5 is to be formed is opened. Then, anisotropic etching such as RIE (Reactive Ion Etching) is performed using the mask to provide the trench 5a having a width of 1 μm or less and a depth having an aspect ratio of 2 or more, for example.

Figure 4A:
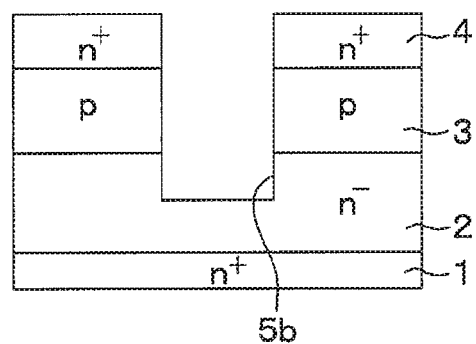
FIG. 4A is a view showing the same process as FIG. 3A in a different cross section.
Figure 5A:
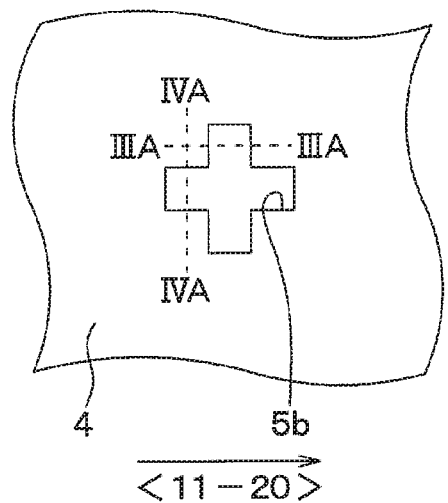
FIG. 5A is a top view of an alignment key.
Figure 5B:
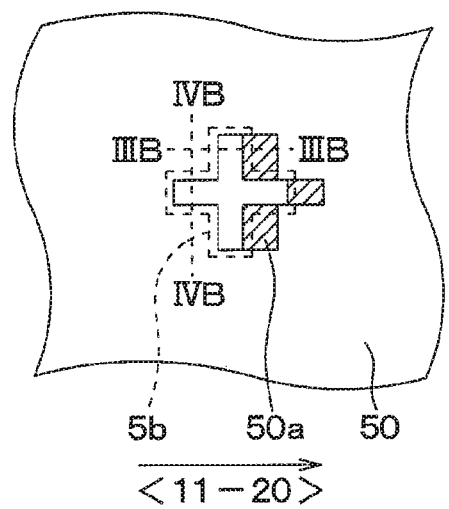
FIG. 5B is a top view of the alignment key.

At that time, as shown in FIGS. 3A and 4A, an alignment trench 5b is provided at a position different from the trench 5a. For example, the alignment trench 5b as an alignment key is provided in a portion of wafer which is different from a portion corresponding to a chip configuring the SiC semiconductor device or in a portion of the wafer which do not affect the vertical MOSFET. In this example, as shown in FIG. 5A, one of the two sides of the alignment trench 5b extends in a direction of <11-20>, but may be of another shape.

Figure 2C:
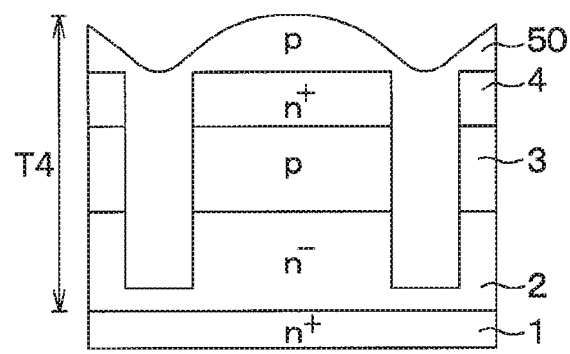
FIG. 2C is a cross-sectional view showing a process for manufacturing the vertical MOSFET continued from FIG. 2B.

[Process Shown in FIG. 2C]

After removing the mask, a p-type SiC layer 50 is formed. At this time, the p-type SiC layer 50 is buried in the trench 5a by the buried epitaxial growth, but since the trench 5a is provided in a line shape having a narrow width, the p-type SiC layer 50 can be surely buried in the trench 5a.

However, a thickness of a portion of the p-type SiC layer 50 located above the surfaces of the trench 5a and the n$^+$-type source region 4 is reduced in a portion corresponding to the trench 5a by an amount corresponding to a portion of the p-type SiC layer 50 buried in the trench 5a. Thus, the surface of the p-type SiC layer 50 has a concavo-convex shape so as to be recessed at a position corresponding to a portion buried in the trench 5a and protrude at a portion where the trench 5a is not provided.

Figure 3B:
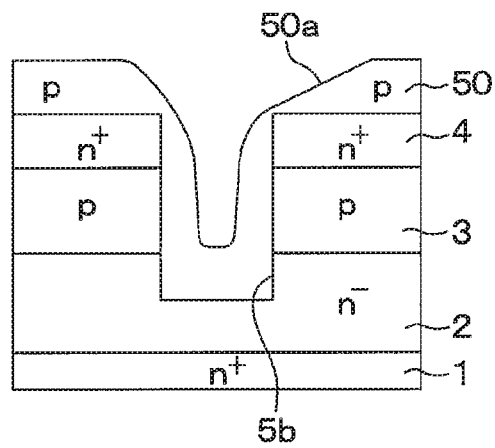
FIG. 3B is a cross-sectional view showing a process for manufacturing the vertical MOSFET continued from FIG. 3A.
Figure 3C:
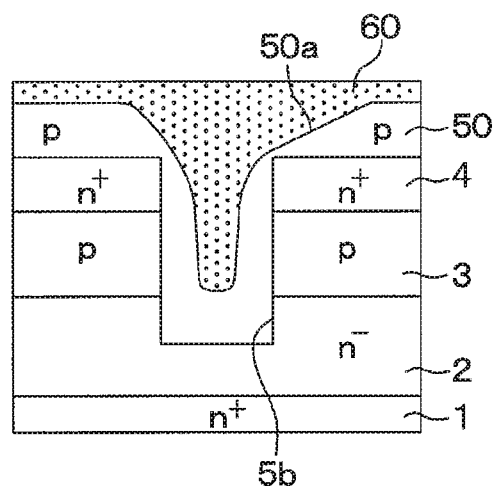
FIG. 3C is a cross-sectional view showing a process for manufacturing the vertical MOSFET continued from FIG. 3B.
Figure 3D:
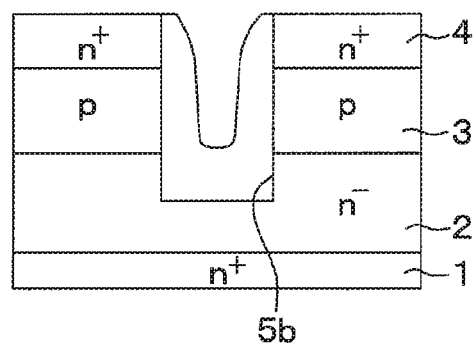
FIG. 3D is a cross-sectional view showing a process for manufacturing the vertical MOSFET continued from FIG. 3C.
Figure 4B:
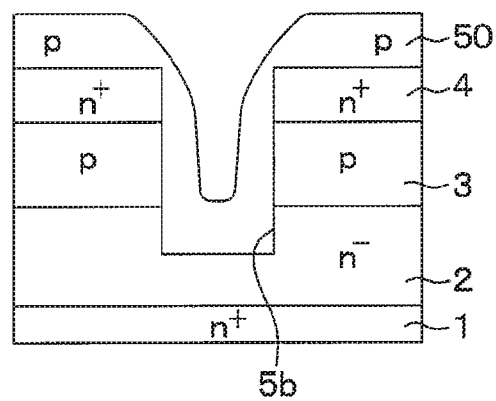
FIG. 4B is a view showing the same process as FIG. 3B in a different cross section.

As shown in FIGS. 3B, 4B, and 5B, the surface of the p-type SiC layer 50 is shaped to be recessed at a position of the p-type SiC layer 50 corresponding to the alignment trench 5b, and a facet 50a caused by the dependence of the epitaxial growth on the plane orientation is formed as shown in FIG. 3B. Specifically, at the position of the alignment trench 5b corresponding to one of the surfaces having the direction of <11-20> as a normal direction, the facet 50a sloping along the off-direction is formed on the surface of the p-type SiC layer 50. As shown in FIG. 5B, when the alignment trench 5b has a cross shape, the facet 50a is not formed on an upstream side in the off-direction, that is, on the opposite side to the side where the facet 50a extends. Thus, in the cross section shown in FIG. 4B, the p-type SiC layer 50 formed on both side surfaces of the alignment trench 5b has a bilaterally symmetric shape, and the facet 50a is not formed.

Figure 2D:
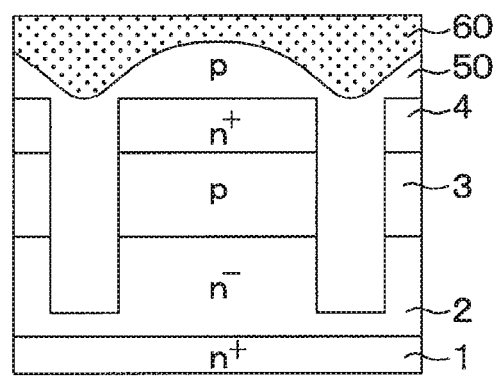
FIG. 2D is a cross-sectional view showing a process for manufacturing the vertical MOSFET continued from FIG. 2C.

[Process Shown in FIG. 2D]

After a sacrificial layer 60 is formed so as to cover a surface of the p-type SiC layer 50, the sacrificial layer 60 is made to flow by reflow at 950 to 1100° C. in an inert gas atmosphere such as a nitrogen gas atmosphere to planarize the surface. The sacrificial layer 60 can be made of phosphosilicate glass (PSG), borophosphosilicate glass (BPSG), or spin on glass (SOG) serving as a flowable oxide film. Since those materials are flowable materials that easily flow by reflow, the surface of the sacrificial layer 60 is planarized by performing reflow. For example, a level difference due to the unevenness of the surface of the sacrificial layer 60 after reflow becomes 0.1 μm or less.

Figure 4C:
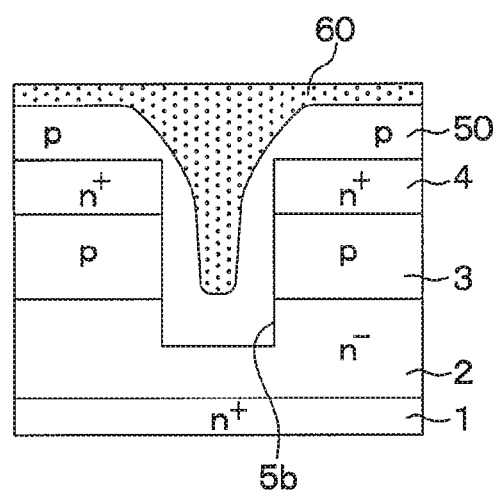
FIG. 4C is a view showing the same process as FIG. 3C in a different cross section.

At that time, as shown in FIG. 3C and FIG. 4C, the sacrificial layer 60 is formed so as to be buried in the portion of the p-type SiC layer 50 recessed at the position corresponding to the alignment trench 5b. Then, when the reflow is performed, the surface of the sacrificial layer 60 becomes a flat surface in the recessed portion as well as the outside of the recessed portion regardless of the presence or absence of the facet 50a.

Figure 2E:
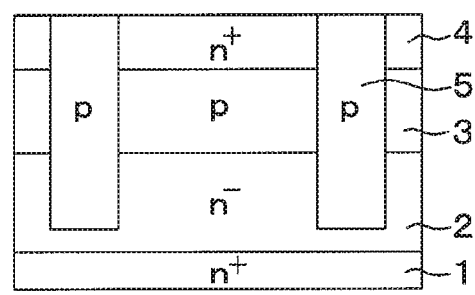
FIG. 2E is a cross-sectional view showing a process for manufacturing the vertical MOSFET continued from FIG. 2D.

[Process Shown in FIG. 2E]

The etching back is performed such that a portion of the p-type SiC layer 50 formed above the surface of the n$^+$-type source region 4 is removed together with the sacrificial layer 60 by dry etching. As a result, the p-type SiC layer 50 remains only in the trench 5a, and the p-type deep layer 5 is formed.

At that time, the etching back is performed so that the etching selectivity between the sacrificial layer 60 and the p-type SiC layer 50 becomes 1, that is, the sacrificial layer 60 and the p-type SiC layer 50 are etched at the same rate. In the etching condition, for example, a mixed gas of SF$_6$ and argon is used although arbitrary, an RF power in the etching device is set to 1200 W, an atmospheric pressure is set to 0.5 Pa, a flow rate of SF$_6$ is set to 3.7 sccm, and a flow rate of argon is set to 500 sccm. In such a dry etching, the SF$_6$ chemically reduces the p-type SiC layer 50, and the argon physically reduces the sacrificial layer 60, allowing an etching selectivity of those layers to become 1.

As a result, the sacrificial layer 60 and the p-type SiC layer 50 are etched back at the same rate, that is, in a flat state, regardless of the unevenness of the surface of the p-type SiC layer 50. Thus, the surface of the n$^+$-type source region 4 and p-type deep layer 5 can be planarized when the etching back is performed until the portion of the p-type SiC layer 50 formed above the surface of the n$^+$-type source region 4 is removed together along with the sacrificial layer 60.

Figure 4D:
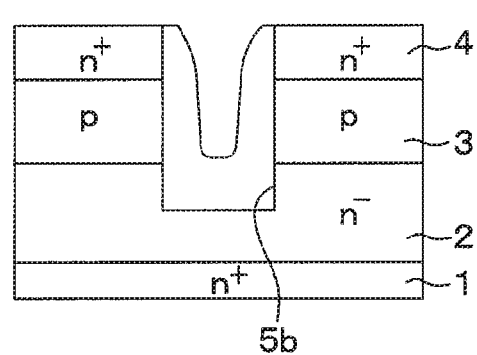
FIG. 4D is a view showing the same process as FIG. 3D in a different cross section.

As shown in FIG. 3D and FIG. 4D, since a position of the alignment key is also covered 60 with the sacrificial layer 60, the surface after removal can be planarized by etching back the p-type SiC layer 50 with the sacrificial layer. Although the facet 50a is formed at the position serving as the alignment key, the facet 50a can be removed when the sacrificial layer 60 and the p-type SiC layer 50 are etched back so that the etching selectivity becomes 1 as described above.

In other words, when the p-type SiC layer 50 is etched back without forming the sacrificial layer 60, the facet 50a remains, but the p-type SiC layer 50 is etched back together with the sacrificial layer 60, thereby being capable of restricting the facet 50a from remaining. Even if the sacrificial layer 60 is not formed, the surface without the facet 50a can be obtained by removing the p-type SiC layer 50 by grinding, but in the case of grinding, the surface becomes rough and unevenness remains, which is not preferable. On the other hand, according to the etching back method of the present embodiment, the surface state is excellent, and the facet 50a can be removed.

In a subsequent process, when the alignment is recognized, an outer edge of the alignment trench 5b, that is, a boundary between the p-type deep layer 5 and the n+-type source region 4 is used as the alignment key. If the facet 50a remains, when recognizing the alignment, a boundary between the facet 50a and a portion which is not the facet 50a may be erroneously recognized instead of the alignment key to be recognized. Thus, the facet 50a is restricted from remaining, thereby obtaining such an effect of inhibiting the occurrence of misalignment.

Since the sacrificial layer 60 is etched back with the p-type SiC layer 50 at the selectivity of 1, the sacrificial layer 60 remains in the alignment trench 5b when the etching back of the p-type SiC layer 50 is completed. Thus, after the p-type SiC layer 50 has been etched back, the sacrificial layer 60 in the alignment trench 5b is removed by switching to a condition where only the sacrificial layer 60 is etched, and similarly thereafter the outer edge of the alignment trench 5b can be used as the alignment key.

Figure 2F:
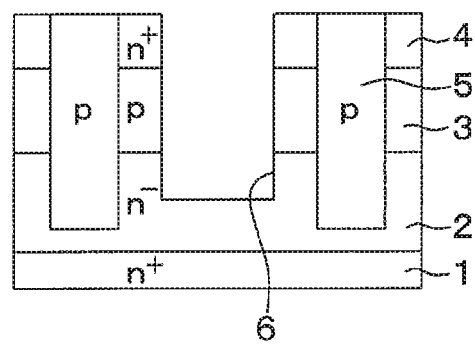
FIG. 2F is a cross-sectional view showing a process for manufacturing the vertical MOSFET continued from FIG. 2E.

[Process Shown in FIG. 2F]

After a mask (not shown) has been formed on the n+-type source region 4 or the like, a region of the mask where the gate trench 6 is to be formed is opened. Then, anisotropic etching such as RIE is performed with the use of the mask to form the gate trench 6. For example, the depth of the gate trench 6 is set to be 0.2 µm to 0.4 µm deeper than a total of the film thickness of the p-type base region 3 and the n+-type source region 4 to perform etching. As a result, the amount of protrusion of the gate trench 6 from a bottom portion of the p-type base region 3 is set to be 0.2 µm to 0.4 µm.

At that time, the mask alignment at the time of forming the gate trench 6 is performed with reference to the alignment key, but as described above, since the facet 50a does not remain, the alignment key can be restricted from being erroneously recognized, and the gate trench 6 can be formed at an accurate position.

Figure 2G:
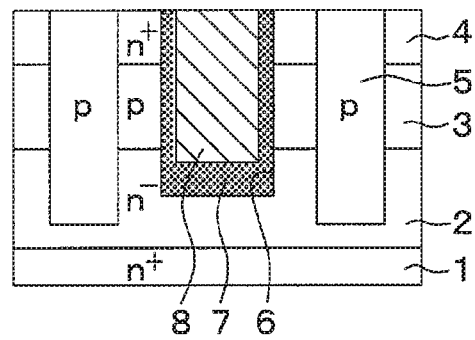
FIG. 2G is a cross-sectional view showing a process for manufacturing the vertical MOSFET following FIG. 2F.

[Process Shown in FIG. 2G]

After removing the mask, for example, thermal oxidation is performed to form the gate insulating film 7, and the gate insulating film 7 covers the inner wall surface of the gate trench 6 and the surface of the n+-type source region 4. Then, after Poly Si doped with a p-type impurity or an n-type impurity has been deposited, Poly-Si is etched back to leave Poly Si at least in the gate trench 6, thereby forming the gate electrode 8.

Figure 2H:
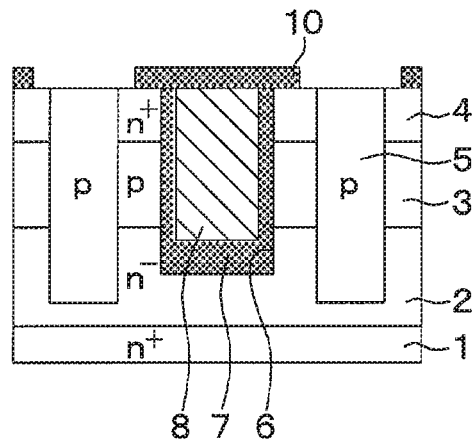
FIG. 2H is a cross-sectional view showing a process for manufacturing the vertical MOSFET subsequent to FIG. 2G.

[Process Shown in FIG. 2H]

The interlayer insulating film 10 made of, for example, an oxide film is formed so as to cover the surfaces of the gate electrode 8 and the gate insulating film 7. After a mask (not shown) has been formed on the surface of the interlayer insulating film 10, a portion of the mask located between the gate electrodes 8, that is, a portion corresponding to the p-type deep layer 5 and the vicinity of the portion are opened. Thereafter, the interlayer insulating film 10 is patterned with the use of a mask to form contact holes exposing the p-type deep layer 5 and the n+-type source region 4.

Though not shown in the following process, an electrode material formed of a multilayer structure made of multiple metals, for example, is formed on the surface of the interlayer insulating film 10. Then, the source electrode 9 is formed by patterning the electrode material. Further, with execution of the processes such as forming the drain electrode 11 on the rear surface of the n+-type substrate 1, the SiC semiconductor device having the vertical MOSFET according to the present embodiment shown in FIG. 1 is completed.

As described above, the sacrificial layer 60 having fluidity is formed on the p-type SiC layer 50 when a portion of the p-type SiC layer 50 for forming the p-type deep layer 5, which is formed above the surface of the n+-type source region 4, is removed. Since the surface of the sacrificial layer 60 is flat due to the fluidity, the p-type SiC layer 50 can be removed so that the surface of the p-type SiC layer 50 becomes flat by etching back the p-type SiC layer 50 together with the sacrificial layer 60 so that the etching selectivity becomes 1. Therefore, the manufacturing method of the SiC semiconductor device capable of planarizing the surfaces of the n+-type source region 4 and the p-type deep layer 5 after the etching-back more simply can be provided. In addition, since the manufacturing method of the SiC semiconductor device can be performed more simply, the manufacturing cost of the SiC semiconductor device can be reduced.

Second Embodiment

A second embodiment will be described. In the present embodiment, a junction barrier Schottky diode (hereinafter referred to as JBS) is provided instead of the vertical MOSFET as a semiconductor device in the first embodiment. Since the other configuration is the same as that of the first embodiment, only portions different from those of the first embodiment will be described.

The JBS is formed in a cell portion of the SiC semiconductor device, and an outer peripheral high breakdown voltage structure such as a guard ring is formed so as to surround the cell region, whereby the SiC semiconductor device is configured, and the JBS will be mainly described now.

Figure 6:
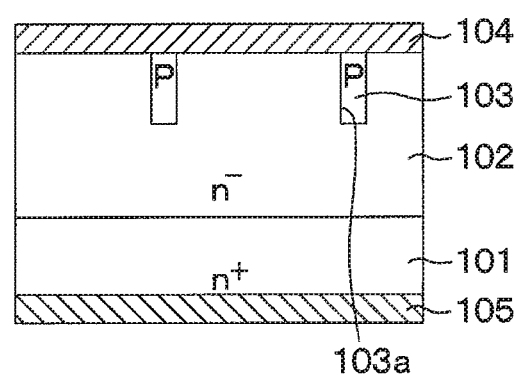
FIG. 6 is a cross-sectional view of a JBS included in a SiC semiconductor device according to a second embodiment.

As shown in FIG. 6, an n−-type drift layer 102 made of SiC having an n-type impurity concentration lower than that of the n+-type substrate 101 is formed on an n+-type substrate 101 made of SiC. In a cell region, a surface layer portion of the n−-type drift layer 102 has striped p-type deep layers 103, which are not shown, and an outer peripheral high breakdown voltage structure such as a guard ring including a p-type layer is provided so as to surround the p-type deep layers 103.

The p-type deep layers 103 are disposed in stripe-shaped trenches 103a in which a plurality of stripe-shaped trenches are disposed at regular intervals in the n−-type drift layer 102, and are each formed of a p-type epitaxial film by buried epitaxial growth. The trenches 103a correspond to deep trenches, and have a width of 1 µm or less and a depth of an aspect ratio of 2 or more, for example.

A Schottky electrode 104 is formed on a top of the n−-type drift layer 102 and the p-type deep layers 103 so as to be brought in contact with surfaces of the n−-type drift layer 102 and the p-type deep layers 103. An ohmic electrode 105 is formed on a rear surface of the n+-type substrate 101.

As described above, in the SiC semiconductor device including a JBS as a semiconductor element, the p-type deep layers 103 are formed by the buried epitaxial growth in the trenches 103a. The same etching back method as that of the first embodiment can be applied to the formation of the p-type deep layers 103. Specifically, a manufacturing method of the SiC semiconductor device according to the present embodiment will be described with reference to FIGS. 7A to 7D.

Figure 7A:
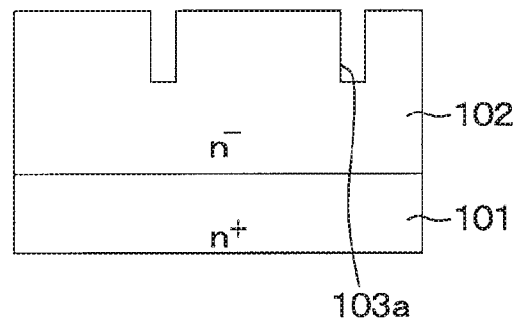
FIG. 7A is a cross-sectional view showing a process for manufacturing the JBS shown in FIG. 6.

[Process Shown in FIG. 7A]

First, a wafer-shaped n+-type substrate 101 is prepared as a semiconductor substrate. An n−-type drift layer 102 made of SiC is epitaxially grown on the main surface of the n+-type substrate 101 to a desired film thickness.

Next, a mask (not shown) is disposed on the surface of the n−-type drift layer 102, and regions of the mask where the p-type deep layers 103 are to be formed are opened. Then, anisotropic etching such as RIE is performed with the use of the mask to form the trenches 103a having a width of 1 μm or less and a depth of an aspect ratio of 2 or more, for example.

Figure 7B:
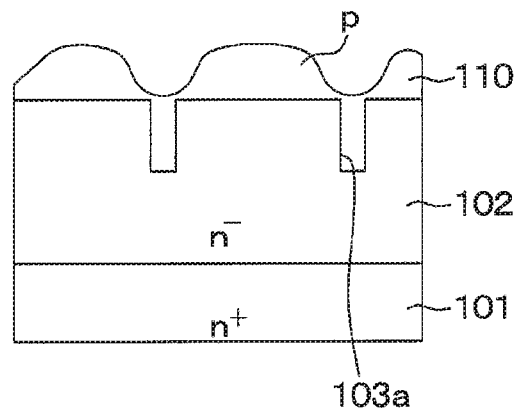
FIG. 7B is a cross-sectional view showing a process for manufacturing the JBS continued from FIG. 7A.

[Process Shown in FIG. 7B]

After removing the mask, a p-type SiC layer 110 is formed. At this time, the p-type SiC layer 110 is buried in the trenches 103a by buried epitaxial growth, but since the trenches 103a are formed in a line shape having a narrow width, the p-type SiC layer 110 can be surely buried in the trenches 103a.

However, a thickness of a portion of the p-type SiC layer 110 located above the surfaces of the trenches 103a and the n−-type drift layer 102 is reduced in portions corresponding to the trenches 103a by an amount corresponding to portions of the p-type SiC layer 110 buried in the trenches 103a. Thus, the surface of the p-type SiC layer 110 has an uneven shape so as to be recessed at positions corresponding to portions buried in the trenches 103a and protrude at portions where the trenches 103a are not provided.

Figure 7C:
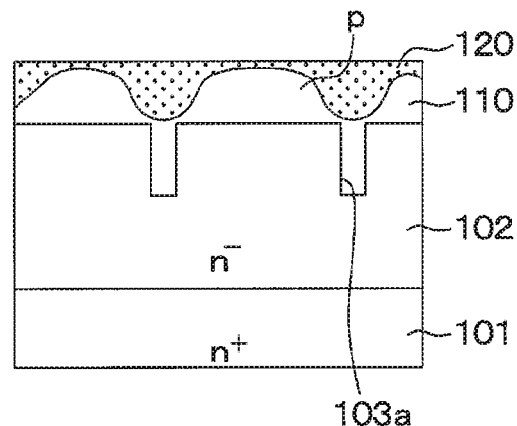
FIG. 7C is a cross-sectional view showing a process for manufacturing the JBS continued from FIG. 7B.

[Process Shown in FIG. 7C]

After the sacrificial layer 120 is formed so as to cover the surface of the p-type SiC layer 110, the sacrificial layer 120 is made to flow by reflow to planarize the surface. The material of the sacrificial layer 120 and the reflow conditions are the same as those in the first embodiment.

Figure 7D:
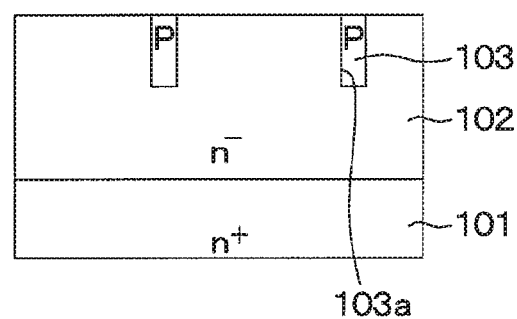
FIG. 7D is a cross-sectional view showing a process for manufacturing the JBS continued from FIG. 7C.

[Process Shown in FIG. 7D]

The etching back is performed so that a portion of the p-type SiC layer 110 formed above the surface of the n−-type drift layer 102 is removed together with the sacrificial layer 120 by dry etching. The etching back method at this time is the same as that of the first embodiment. As a result, the p-type SiC layer 110 remains only in the trenches 103a, and the p-type deep layer 5 is formed. In other words, since the sacrificial layer 120 and the p-type SiC layer 110 are etched back at the same rate regardless of the unevenness of the surface of the p-type SiC layer 50, the surfaces of the n−-type drift layer 102 and the p-type deep layers 103 can be planarized.

Though a subsequent process is not shown in the drawing, the Schottky electrode 104 is formed on the front surface side of the n−-type drift layer 102 and the p-type deep layers 103, and the ohmic electrode 105 is formed on the rear surface side of the n+-type substrate 101. As a result, the SiC semiconductor device according to the present embodiment is completed.

As described above, the same etching back method as in the first embodiment can be applied to the SiC semiconductor device having the JBS formed by the buried epitaxial growth of the p-type deep layers 103 in the trenches 103a. Accordingly, the same effects as the first embodiment can be obtained.

Third Embodiment

A third embodiment will be described. In the present embodiment, the same processes as those in the first and second embodiments are performed when planarizing the unevenness caused by the step bunching during the epitaxial growth.

For example, in the SiC semiconductor device shown in FIG. 1 described in the first embodiment, as shown in FIG. 2A, the n−-type drift layer 2 made of SiC and the like are epitaxially grown on the main surface of an n+-type substrate 1 to a desired film thickness. At this time, since the unevenness due to step bunching can be formed, the unevenness is planarized. Specifically, processes shown in FIGS. 8A to 8D are performed.

Figure 8A:
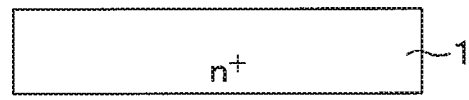
FIG. 8A is an enlarged cross-sectional view of a part of a process for manufacturing the vertical MOSFET according to a third embodiment.
Figure 8B:
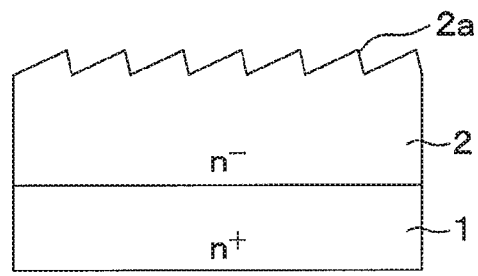
FIG. 8B is a cross-sectional view showing a process for manufacturing the vertical MOSFET continued from FIG. 8A.

First, as shown in FIG. 8A, the n+-type substrate 1 is prepared. Then, as shown in FIG. 8B, the n−-type drift layer 2 made of SiC is epitaxially grown on the main surface of the n+-type substrate 1. At this time, since the n+-type substrate 1 is an off-substrate having the off-angle, the surface of the n−-type drift layer 2 formed on the n+-type substrate 1 becomes an uneven surface 2a on which unevenness due to step bunching is formed.

Figure 8C:
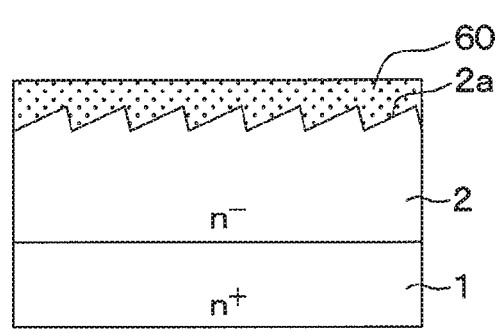
FIG. 8C is a cross-sectional view showing a process for manufacturing the vertical MOSFET continued from FIG. 8B.

Thus, as shown in FIG. 8C, after the sacrificial layer 60 is formed so as to cover the uneven surface 2a of the n−-type drift layer 2, the sacrificial layer 60 is made to flow by reflow at 950 to 1100° C. in an inert gas atmosphere such as a nitrogen gas atmosphere, for example, to planarize the surface. As in the first embodiment, the sacrificial layer 60 can be made of PSG, BPSG, SOG, or the like serving as a flowable oxide film.

Figure 8D:
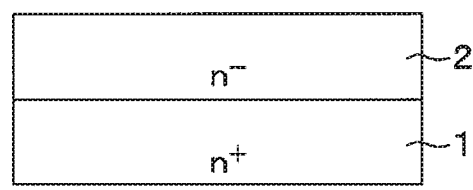
FIG. 8D is a cross-sectional view showing a process for manufacturing the vertical MOSFET continued from FIG. 8C.

Then, as shown in FIG. 8D, etching back is performed to partially remove the uneven surface 2a of the n−-type drift layer 2 along with the sacrificial layer 60 by the dry etching. At this time, etching back is performed so that the etching selectivity between the sacrificial layer 60 and the n−-type drift layer 2 becomes 1, that is, the sacrificial layer 60 and the n−-type drift layer 2 are etched at the same rate. The etching conditions may be the same as those of the first embodiment, for example. As a result, the surface of the n−-type drift layer 2 can be planarized.

As described above, even when the n−-type drift layer 2 made of SiC is formed on the main surface of the n+-type substrate 1 and unevenness is formed on the main surface by step bunching, the sacrificial layer 60 is formed, and then the n−-type drift layer 2 together with the sacrificial layer 60 are etched back to have the selectivity of 1. Accordingly, unevenness in the surface of the n−-type drift layer 2 can be removed and the surface can be planarized.

Although the case where the surface of the n−-type drift layer 2 is planarized has been described in the above example, the surfaces of the p-type base region 3 and the n+-type source region 4 formed on the n−-type drift layer 2 may also be planarized by etching back with the use of the sacrificial layer 60 so as to have the selectivity of 1. Only one of the n−-type drift layer 2, the p-type base region 3, and the n+-type source region 4 may be planarized, or any of two or more of the above-described components may be planarized.

Fourth Embodiment

A fourth embodiment will be described. In the present embodiment, the same processes as those in the first and second embodiments are performed when planarizing the unevenness by step bunching that occurs when the activation annealing treatment is performed after ion implantation of impurities is performed. In this case, as an example, a JBS will be described as an example.

Figure 9:
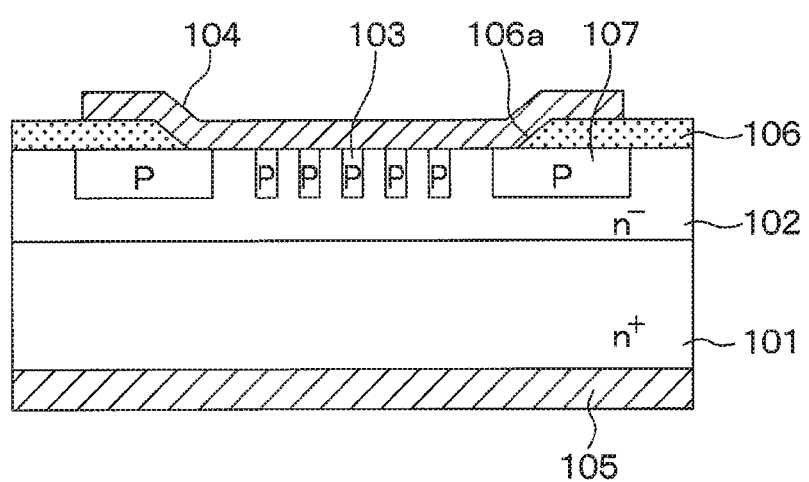
FIG. 9 is a cross-sectional view of a JBS included in a SiC semiconductor device according to a fourth embodiment.

As shown in FIG. 9, the SiC semiconductor device according to the present embodiment is also provided with the JBS as in the second embodiment. The JBS is formed of an n$^+$-type substrate 101. On the n$^+$-type substrate 101, an n$^-$-type drift layer 102 made of SiC having an n-type impurity concentration lower than an impurity concentration of the n$^+$-type substrate 101 is formed. The JBSs are formed in cell portions of the SiC semiconductor substrate formed of the n$^+$-type substrate 1 and the n$^-$-type drift layer 102, and a termination structure (not shown) is formed in an outer peripheral region of each JBS, thereby forming the SiC semiconductor device according to the present embodiment.

Specifically, a plurality of p-type deep layers 103 are arrayed at regular intervals in the surface layer portion of the n$^-$-type drift layer 102 to form stripes. A Schottky electrode 104 made of Mo (molybdenum), for example, is formed on the surfaces of the n$^-$-type drift layer 102 and the p-type deep layers 103. The Schottky electrode 104 is in Schottky contact with the n$^-$-type drift layer 102. An insulating film 106 made of, for example, a silicon oxide film is formed on the surface of the n$^-$-type drift layer 102, and the Schottky electrode 104 is formed on the insulating film 106. The Schottky electrode 104 are brought in contact with the surfaces of the n$^-$-type drift layer 102 and the p-type deep layers 103 through openings 106a partially provided in the cell portion of the insulating film 106.

Further, p-type resurf layers 107 are formed along outer edges of the openings 106a. A guard ring (not shown) or the like is further provided on the outer periphery of the p-type resurf layer 107, thereby providing an outer peripheral high breakdown voltage structure. An ohmic electrode 105 made of, for example, Ni (nickel), Ti (titanium), Mo, Au (gold), or the like is formed so as to come in contact with a rear surface of the n$^+$-type substrate 101, thereby forming a SiC semiconductor device including the JBSs.

In the SiC semiconductor device configured as described above, for example, the n$^-$-type drift layer 102 is epitaxially grown on the n$^+$-type substrate 101, and then ion implantation is performed to perform an activation annealing treatment, thereby being capable of forming the p-type deep layers 103 and the p-type resurf layers 107. At this time, since unevenness due to step bunching may be be formed, the unevenness is planarized. Specifically, processes shown in FIGS. 10A to 10D are performed.

Figure 10A:
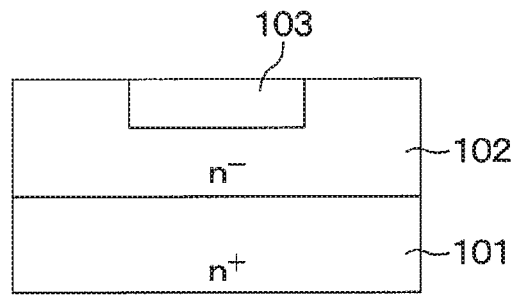
FIG. 10A is an enlarged cross-sectional view of a part of a process for manufacturing the vertical MOSFET shown in FIG. 9.
Figure 10B:
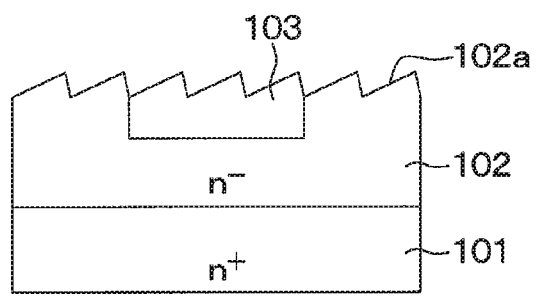
FIG. 10B is a cross-sectional view showing a process for manufacturing the vertical MOSFET continued from FIG. 10A.

First, as shown in FIG. 10A, the n$^+$-type substrate 101 is prepared, and then the n$^-$-type drift layer 102 made of SiC is epitaxially grown on the main surface of the n$^+$-type substrate 101. Further, a p-type impurity is ion-implanted into regions in which the p-type deep layers 103 are to be formed with the use of a mask (not shown). Although only the p-type deep layer 103 is shown in this example, p-type impurities are also implanted into regions in which the p-type resurf layers 107 are to be formed at the same time. Then, the activation annealing treatment is performed. At this time, the n$^+$-type substrate 1 is an off-substrate having an off-angle, and the n$^-$-type drift layer 102 formed on the off-substrate takes over the off-angle. Thus, as shown in FIG. 10B, the uneven surface 102a in which the unevenness caused by the step bunching is formed on the surface of the n$^-$-type drift layer 102 including the surface of the p-type deep layers 103 and the p-type resurf layer 107 is formed by the annealing treatment.

Figure 10C:
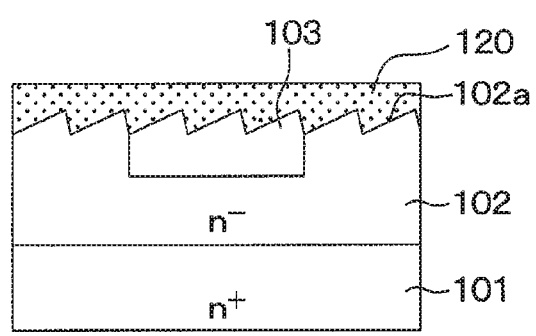
FIG. 10C is a cross-sectional view showing a process for manufacturing the vertical MOSFET continued from FIG. 10B.

Thus, as shown in FIG. 10C, after the sacrificial layer 60 is formed so as to cover the uneven surface 102a of the n$^-$-type drift layer 102 including the surfaces of the p-type deep layers 103, the sacrificial layer 60 is made to flow by reflow at 950° C. to 1100° C. in the inert gas atmosphere such as a nitrogen gas atmosphere to planarize the surface. As in the first embodiment, the sacrificial layer 60 can be made of PSG, BPSG, SOG, or the like serving as a flowable oxide film.

Figure 10D:
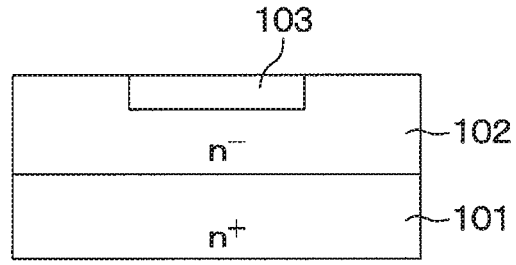
FIG. 10D is a cross-sectional view showing a process for manufacturing the vertical MOSFET continued from FIG. 10C.

Then, as shown in FIG. 10D, etching back is performed by dry etching so as to partially remove the uneven surface 102a of the n$^-$-type drift layer 102 including the surface of the p-type deep layers 103 and the like together with the sacrificial layer 60. At that time, the etching back is performed so that the etching selectivity between the sacrificial layer 60, the n$^-$-type drift layer 102, the p-type deep layers 103, and the like becomes 1, that is, so that the sacrificial layer 60 and the n$^-$-type drift layer 102, the p-type deep layer 103, and the like are etched at equal rates. The etching conditions may be the same as those of the first embodiment, for example. As a result, the surfaces of the n$^-$-type drift layer 102, the p-type deep layers 103, and the like can be planarized.

As described above, even when the activation annealing treatment is performed after the ion implantation to form unevenness caused by step bunching, the sacrificial layer 60 is formed, and then the n$^-$-type drift layer 102, the p-type deep layers 103, and the like are etched back together with the sacrificial layer 60 at the selectivity of 1. As a result, the unevenness of the surfaces of the n$^-$-type drift layer 102, the p-type deep layers 103, and the like can be removed, and the surface can be planarized.

Other Embodiments

Although the present disclosure has been described in accordance with the embodiments described above, the present disclosure is not limited to the embodiments described above, and encompasses various modifications and variations within the scope of equivalents. In addition, various combinations and configurations, as well as other combinations and configurations that include only one element, more, or less, are within the scope and spirit of the present disclosure.

For example, in the first embodiment, the n$^-$-type drift layer 2, the p-type base region 3, and the n$^+$-type source region 4 are formed on the n$^+$-type substrate 1 as the base layer. Similarly, in the second embodiment, the n$^-$-type drift layer 102 is formed on the n$^+$-type substrate 101 as the base layer. However, the above configuration is merely an example, and any other configuration may be used as long as the trenches are provided in the base layer and then the SiC layer is formed by buried epitaxial growth in the trenches, and a portion of the SiC layer above the surface of the base layer is etched back.

In the first and second embodiments, the structure in which the SiC layer remains only in the trenches formed in the base layer when the SiC layer is etched back together with the sacrificial layer has been described. However, this is also merely an example, and a structure in which a part of the SiC layer remains on the surface of the base layer may be used. Also in the structure described above, the surface of the SiC layer can be planarized by applying the etching back method described above.

In the third and fourth embodiments, when the semiconductor substrate formed of the off-substrate having the off-angle is used, an example of planarization of an uneven surface of the surface of the SiC layer epitaxially grown on the semiconductor substrate or an uneven surface on which an impurity layer is formed by ion implantation has been described. However, those configurations are merely examples, and may be applied to a manufacturing method of a SiC semiconductor device in the case where a similar uneven surface is formed.

In the first and third embodiments and the like, the vertical MOSFET is exemplified as the semiconductor element included in the SiC semiconductor device, but the SiC semiconductor device may include only the vertical MOSFET but also other semiconductor elements. Further, although the n-channel type MOSFET in which the first conductivity type is the n-type and the second conductivity type is the p-type has been exemplified, a p-channel type MOSFET in which the conductivity types of the constituent elements are inverted may be used. In the above descriptions, the MOSFET has been exemplified as the semiconductor device, but the present disclosure can be applied to the IGBT having the same structure. The IGBT only changes the conductivity type of the $n^+$-type substrate 1 from the n-type substrate to the p-type substrate for each of the above embodiments, and the structures and manufacturing methods of the substrate are the same as those of each of the above embodiments. Further, although the trench gate structure is exemplified as the vertical MOSFET, the trench gate structure is not limited to the trench gate structure, and the trench gate structure may be a planar type.

It should be noted that if the orientation of the crystal is to be indicated, a bar (−) should originally be attached above the desired number, but since there are restrictions on the representation based on the electronic application, the bar is attached before the desired number in this specification.

What is claimed is:

1. A manufacturing method of a silicon carbide semiconductor device, comprising:
    preparing a semiconductor substrate made of silicon carbide and on which a base layer is formed;
    providing a trench in the base layer;
    epitaxially growing a silicon carbide layer on a surface of the base layer while filling the trench with the silicon carbide layer;
    forming a sacrificial layer on a surface of the silicon carbide layer;
    planarizing the sacrificial layer by reflow after forming the sacrificial layer; and
    etching back the silicon carbide layer together with the sacrificial layer that is planarized by dry etching under an etching condition in which an etching selectivity of the silicon carbide layer to the sacrificial layer is 1, wherein
    the providing of the trench includes providing an alignment trench at a position different from the trench in the base layer,
    the epitaxially growing the silicon carbide layer includes forming the silicon carbide layer to fill the alignment trench with the silicon carbide layer,
    the forming the sacrificial layer includes forming the sacrificial layer also on the silicon carbide layer formed to fill the alignment trench, and
    the etching back is performed until a facet included in a recess provided at a position corresponding to the alignment trench in the surface of the silicon carbide layer is removed.

2. The manufacturing method according to claim 1, wherein
    the etching back includes exposing a surface of the base layer and leaving the silicon carbide layer only in the trench.

3. The manufacturing method according to claim 1, wherein
    the forming the sacrificial layer includes forming one of PSG, BPSG, or SOG as the sacrificial layer.

4. The manufacturing method according to claim 1, wherein
    the preparing the semiconductor substrate on which the base layer is formed includes preparing a silicon carbide substrate of a first conductivity type or a second conductivity type as the semiconductor substrate, and forming, as the base layer, a drift layer of the first conductivity type made of silicon carbide having an impurity concentration lower than an impurity concentration of the silicon carbide substrate, a base region of the second conductivity type made of silicon carbide, and a source region of the first conductivity type made of silicon carbide having an impurity concentration higher than the impurity concentration of the drift layer on the silicon carbide substrate in a stated order,
    the etching back includes forming a deep layer of the second conductivity type in the trench by performing the etching back until a surface of the source region is exposed, and
    the manufacturing method further comprising:
        after forming the deep layer, forming a trench gate structure in which a gate trench deeper than the base region is provided from the surface of the source region, a gate insulating film is formed on an inner wall surface of the gate trench, and a gate electrode is formed on the gate insulating film;
        forming a source electrode electrically connected to the source region and the deep layer; and
        forming a drain electrode on a rear surface of the semiconductor substrate.

5. The manufacturing method according to claim 1, wherein
    the preparing the semiconductor substrate on which the base layer is formed includes preparing a silicon carbide substrate of a first conductivity type as the semiconductor substrate, and forming, as the base layer, a drift layer of a first conductivity type made of silicon carbide having an impurity concentration lower than an impurity concentration of the silicon carbide substrate,
    the etching back includes forming a deep layer of a second conductivity type in the trench by performing the etching back until a surface of the drift layer is exposed, and
    the manufacturing method further comprising:
        forming a Schottky electrode electrically connected to the drift layer and the deep layer; and
        forming an ohmic electrode on a rear surface of the semiconductor substrate.

* * * * *